(12) United States Patent
Naser-Ghodsi et al.

(10) Patent No.: US 7,879,730 B2
(45) Date of Patent: *Feb. 1, 2011

(54) ETCH SELECTIVITY ENHANCEMENT IN ELECTRON BEAM ACTIVATED CHEMICAL ETCH

(75) Inventors: Mehran Naser-Ghodsi, Hamilton, MA (US); Garrett Pickard, Mountain View, CA (US); Rudy F. Garcia, Union City, CA (US); Tzu-Chin Chuang, Cupertino, CA (US); Ming Lun Yu, Fremont, CA (US); Kenneth Krzeczowski, Scotts Valley, CA (US); Matthew Lent, Livermore, CA (US); Sergey Lopatin, Morgan Hill, CA (US); Chris Huang, Cupertino, CA (US); Niles K. MacDonald, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 829 days.

This patent is subject to a terminal disclaimer.

(21) Appl. No.: 11/622,605

(22) Filed: Jan. 12, 2007

(65) Prior Publication Data

US 2007/0158304 A1 Jul. 12, 2007

Related U.S. Application Data

(60) Provisional application No. 60/758,818, filed on Jan. 12, 2006, provisional application No. 60/829,643, filed on Oct. 16, 2006, provisional application No. 60/829,636, filed on Oct. 16, 2006, provisional application No. 60/829,659, filed on Oct. 16, 2006.

(51) Int. Cl.
*H01L 21/302* (2006.01)
*H01L 21/461* (2006.01)

(52) U.S. Cl. ............ 438/706; 438/710; 438/711; 438/714; 216/12; 216/21; 216/62

(58) Field of Classification Search .............. None
See application file for complete search history.

(56) References Cited

U.S. PATENT DOCUMENTS 4,315,782 A 2/1982 Tarng (Continued)

FOREIGN PATENT DOCUMENTS

JP 401105539 * 4/1989

OTHER PUBLICATIONS

U.S. Appl. No. 60/758,818 entitled "Tungsten Plug Deposition Quality Evaluation Method by EBACE Tecnology" to Yehiel Gotkis, filed Jan. 12, 2006.

(Continued)

*Primary Examiner*—Duy-Vu N Deo
(74) *Attorney, Agent, or Firm*—Joshua D. Isenberg; JDI Patent

(57) ABSTRACT

Etch selectivity enhancement during electron beam activated chemical etch (EBACE) is disclosed. A target or portion thereof may be exposed to a gas composition of a type that etches the target when the gas composition and/or target are exposed to an electron beam. By directing an electron beam toward the target in the vicinity of the gas composition, an interaction between the electron beam and the gas composition etches a portion of the target exposed to both the gas composition and the electron beam. Selectivity of etching of the target due to interaction between the electron beam and gas composition may be enhanced in a number of ways.

19 Claims, 11 Drawing Sheets

U.S. PATENT DOCUMENTS

| | | | |
|---|---|---|---|
| 4,622,095 | A | 11/1986 | Grobman et al. |
| 4,897,552 | A | 1/1990 | Okunuki et al. |
| 4,966,885 | A | 10/1990 | Hebard |
| 4,994,140 | A | 2/1991 | Kenzo et al. |
| 5,188,706 | A | 2/1993 | Hori et al. ............... 216/12 |
| 5,346,841 | A | 9/1994 | Yajima |
| 5,502,306 | A | 3/1996 | Meisburger et al. |
| 5,686,171 | A | 11/1997 | Vokoun et al. ............ 428/209 |
| 5,736,002 | A | 4/1998 | Allen et al. |
| 6,027,842 | A | 2/2000 | Ausschnitt et al. |
| 6,133,147 | A | 10/2000 | Rhee et al. |
| 6,593,171 | B2 | 7/2003 | Farnworth |
| 6,673,637 | B2 | 1/2004 | Wack et al. |
| 6,753,538 | B2 | 6/2004 | Musil et al. ............ 250/492.2 |
| 6,771,806 | B1 | 8/2004 | Satya et al. |
| 6,787,783 | B2 | 9/2004 | Marchman et al. |
| 6,801,596 | B2 | 10/2004 | Nasser-Ghodsi et al. |
| 6,843,927 | B2 | 1/2005 | Nasser-Ghodsi ............ 216/84 |
| 6,943,350 | B2 | 9/2005 | Nasser-Ghodsi et al. .... 250/310 |
| 7,148,073 | B1 * | 12/2006 | Soltz et al. ................ 438/4 |
| 7,312,448 | B2 | 12/2007 | Principe |
| 7,348,556 | B2 | 3/2008 | Chitturi et al. |
| 7,709,792 | B2 | 5/2010 | Nasser-Ghodsi et al. |
| 2002/0048913 | A1 | 4/2002 | Finney |
| 2003/0047691 | A1 * | 3/2003 | Musil et al. ............ 250/492.2 |
| 2004/0013858 | A1 | 1/2004 | Hacker et al. ............ 428/195.1 |
| 2004/0033425 | A1 * | 2/2004 | Koops et al. ................ 430/5 |
| 2004/0041095 | A1 | 3/2004 | Nasser-Ghodsi et al. |
| 2004/0266200 | A1 | 12/2004 | Schaller et al. ............ 438/705 |
| 2005/0048751 | A1 | 3/2005 | Moore |
| 2006/0000802 | A1 | 1/2006 | Kumar et al. ............... 216/67 |
| 2007/0069759 | A1 | 3/2007 | Rzepiela et al. |
| 2007/0158303 | A1 | 7/2007 | Nasser-Ghodsi et al. ....... 430/5 |
| 2007/0158304 | A1 | 7/2007 | Nasser-Ghodsi et al. ...... 216/66 |
| 2007/0158562 | A1 | 7/2007 | Nasser-Ghodsi et al. .... 250/310 |
| 2008/0088831 | A1 | 4/2008 | Mulders et al. |

OTHER PUBLICATIONS

U.S. Appl. No. 60/829,636 entitled "Etch Selectivity Enhancement in Electron Beam Activated Chemical Etch" to Nasser-Ghodsi; Mehran; et al., filed Oct. 16, 2006.

U.S. Appl. No. 60/829,643 entitled "Structural Modification Using Electron Beam Activated Chemical Etch" to Nasser-Ghodsi; Mehran; et al., filed Oct. 16, 2006.

U.S. Appl. No. 60/829,659 entitled "Three-Dimensional Imagine Using Electron Beam Activated Chemical Etch" to Nasser-Ghodsi; Mehran; et al., filed Oct. 16, 2006.

U.S. Appl. No. 11/622,793 entitled "Tungsten Plug Deposition Quality Evaluation Method by EBACE Technology" to Yehiel Gotkis, filed Jan. 12, 2007.

International Search Report and Written Opinion for International Application No. PCT/US07/60503.

A. Jain et al., "Thin Solid Films" vol. 269, pp. 51-56, 1995.

Office Action dated Mar. 29, 2010 for U.S. Appl. No. 11/622,793.

Office Action dated Dec. 7, 2009 for U.S. Appl. No. 11/622,625.

Kowalksi, Ion Bombardment modification of surface morphology of Solids, 1994, Journal of Materials Science, vol. 29, pp. 3542-3552.

Notice of Allowance and Fee(s) dated Dec. 17, 2009 for U.S. Appl. No. 11/622,758.

Asakawa et al. Chlorine Based Dry Etching og III/V Compound Semiconductors for Optoelectronics Application, Nov. 18, 1997, Japanese Journal of Applied Physics, vol. 37, pp. 373-387.

Jain et al., Thermal Dry-Etching of Copper Using Hydrogen peroxide and Hexafluroacetylacetone, Thin Solid Films 269 (1995) pp. 51-56.

Definition of word "embed"—Definition and More from the Free Merriam-Webster Dictionary-download from link http://www.merriam-webster.com/dictionary/embed on Mar. 18, 2010, 2 pages.

Final Office Action dated Jul. 1, 2010 issued for U.S. Appl. No. 11/622,793.

Matsui et al, Electron Beam induced Selective Etching and Deposition Technology, 1989, Journal of Vacuum Science and Technology, Sept/October, 1182-1190.

Wang et al, Etching Characteristics of Chromium Thin Films by an Electron Beam Induced Surface Reasction, 2003, Semiconductor Science and Technology, vol. 18, 199-205.

Office Action dated Jun. 10, 2010 issued for U.S. Appl. No. 11/622,625.

Office Action dated Apr. 13, 2010 issued for U.S. Appl. No. 11/752,829.

PSII, An Introduction to Plasma Source Ion Implantation, University of Wisconsin Center for Plasma Aided Manufacturing, Oct. 30, 2005.

Office Action dated Sep. 13, 2010 issued for U.S. Appl. No. 11/622,793.

Office Action dated Sep. 13, 2010 issued for U.S. Appl. No. 11/752,829.

Office Action dated Dec. 3, 2010 issued for U.S. Appl. No. 11/622,625.

Toyoda et al., Ultra Smooth Surface Preparation using Gas Cluster Ion Beams, 2002, Japanese Journal of Applied Physics, vol. 41, pp. 4287-4290.

* cited by examiner

200

202 — EXPOSE TARGET OR PORTION THEREOF TO GAS COMPOSITION

204 — DIRECT ELECTRON BEAM TOWARD TARGET IN VICINITY OF GAS COMPOSITION TO ETCH A PORTION OF THE TARGET EXPOSED TO THE GAS COMPOSITION AND ELECTRON BEAM

206 — ENHANCE SELECTIVITY OF ETCHING OF TARGET DUE TO INTERACTION BETWEEN ELECTRON BEAM AND GAS COMPOSITION

FIG. 2

ETCH SELECTIVITY ENHANCEMENT IN ELECTRON BEAM ACTIVATED CHEMICAL ETCH

CLAIM OF PRIORITY

This application claims the benefit of priority of co-pending U.S. Provisional Application No. 60/758,818 entitled to Yehiel Gotkis, Sergey Lopatin and Mehran Nasser-Ghodsi filed Jan. 12, 2006 and entitled, "TUNGSTEN PLUG DEPOSITION QUALITY EVALUATION METHOD BY EBACE TECHNOLOGY", the entire disclosures of which are incorporated herein by reference.

This application claims the benefit of priority of co-pending U.S. Provisional Application No. 60/829,643 to Mehran Nasser-Ghodsi et al filed the same day as the present application and entitled, "STRUCTURAL MODIFICATION USING ELECTRON BEAM ACTIVATED CHEMICAL ETCH", the entire disclosures of which are incorporated herein by reference.

This application claims the benefit of priority of co-pending U.S. Provisional Application No. 60/829,636 to Mehran Nasser-Ghodsi et al filed the same day as the present application and entitled, "ETCH SELECTIVITY ENHANCEMENT IN ELECTRON BEAM ACTIVATED CHEMICAL ETCH", the entire disclosures of which are incorporated herein by reference.

This application claims the benefit of priority of co-pending U.S. Provisional Application No. 60/829,659 to Mehran Nasser-Ghodsi et al filed the same day as the present application and entitled, "THREE-DIMENSIONAL IMAGING USING ELECTRON BEAM ACTIVATED CHEMICAL ETCH", the entire disclosures of which are incorporated herein by reference.

CROSS REFERENCE TO RELATED APPLICATIONS

This application is related to co-pending U.S. application Ser. No. 11/622,793 to Yehiel Gotkis, Sergey Lopatin and Mehran Nasser-Ghodsi filed Jan. 12, 2006 and entitled, "TUNGSTEN PLUG DEPOSITION QUALITY EVALUATION METHOD BY EBACE TECHNOLOGY", the entire disclosures of which are incorporated herein by reference.

This application is also related to co-pending U.S. patent application Ser. No. 11/622,625 to Mehran Nasser-Ghodsi et al filed the same day as the present application and entitled, "STRUCTURAL MODIFICATION USING ELECTRON BEAM ACTIVATED CHEMICAL ETCH", the entire disclosures of which are incorporated herein by reference.

This application is also related to co-pending U.S. patent application Ser. No. 11/622,758 to Mehran Nasser-Ghodsi et al filed the same day as the present application and entitled, "THREE-DIMENSIONAL IMAGING USING ELECTRON BEAM ACTIVATED CHEMICAL ETCH", the entire disclosures of which are incorporated herein by reference.

FIELD OF THE INVENTION

This invention generally relates to semiconductor fabrication and more particularly to electron beam activated chemical etching (eBACE).

BACKGROUND OF THE INVENTION

A technique known as electron beam activated chemical etch (EBACE) has been developed as an analytical tool in semiconductor fabrication. In this technique an etchant, typically in the form of a gas or vapor, is introduced into the field of view of a scanning electron microscope proximate the surface of a target, such as an integrated circuit device. The etchant is usually one that is known to etch the target material upon electron-beam induced activation. The electron beam from the electron microscope activates the etchant resulting in etching of the target surface in locations exposed to both the etchant and the electron beam. The resulting localized etching of the target surface can be combined with real time imaging of the surface as it is etched.

It is within this context that embodiments of the present invention arise.

BRIEF DESCRIPTION OF THE DRAWINGS

Other objects and advantages of the invention will become apparent upon reading the following detailed description and upon reference to the accompanying drawings in which:

FIG. 2 is a flow diagram illustrating an example of a method for etch selectivity enhancement during eBACE according to an embodiment of the present invention.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1A:
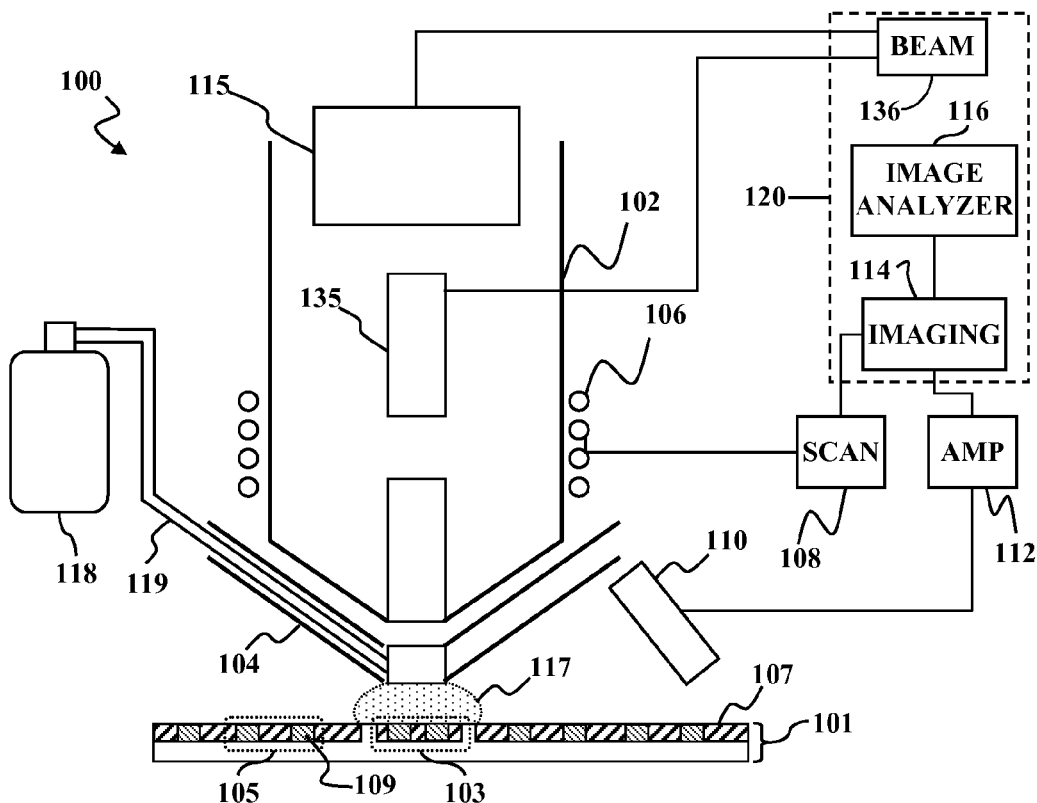
FIG. 1A is a schematic diagram of an electron beam activated chemical etch (EBACE) system adapted for etch selectivity enhancement according to an embodiment of the present invention.
Figure 1B:
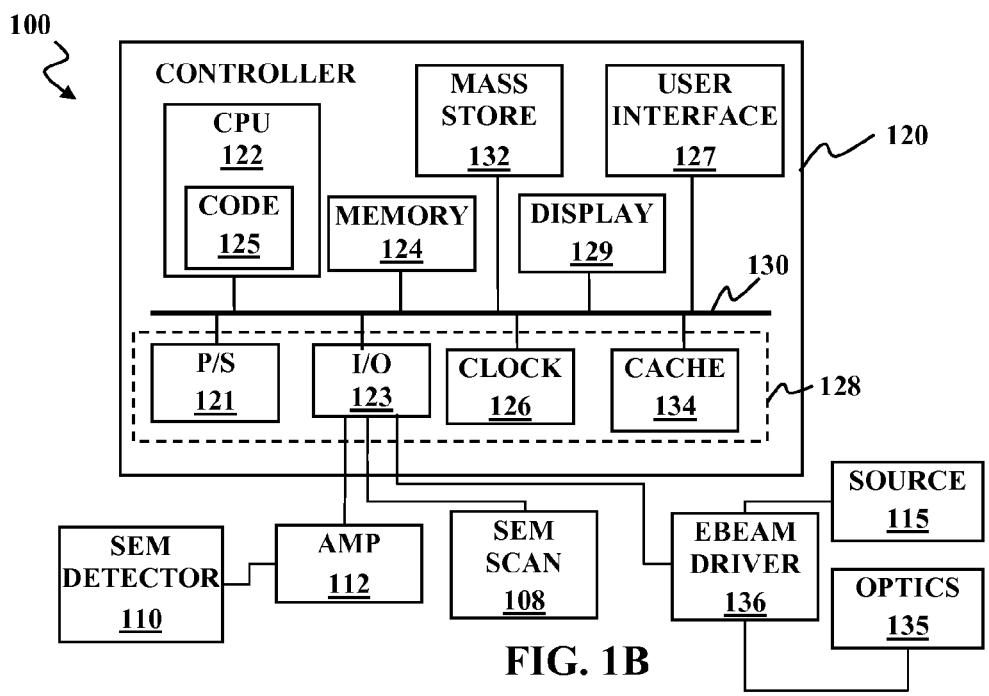
FIG. 1B is a block diagram of the system of FIG. 1A.

FIGS. 1A-1B illustrate an example of an electron beam activated chemical etch (EBACE) system 100 adapted for use with embodiments of the present invention. As shown in FIG. 1A, the system 100 generally includes a scanning electron microscope having an electron beam column 102 with an electron source 115, beam optics 135 an immersion lens 104. The electron beam column 102 may be controlled by electronics 136, referred to herein as an e-beam driver. The e-beam driver 136 may control the electron source 115, beam optics 135 and immersion lens 104.

Electrons from the electron beam column 102 are focused onto a target surface 101, which may be an integrated circuit wafer or a test wafer. The electrons are scanned across the surface of the target 101 by magnet deflecting fields provided by one or more scanning coils 106. Current is provided to the coils 106 via a scanner driver 108. Electrons striking the target 101 are either backscattered or initiate secondary emission. Either way a detector 110 generates a signal proportional to the amount of backscattering or secondary emission. The signal may be amplified by an amplifier 112. The amplified signal and a signal from the scanner driver 108 are combined by an image generator 114 to produce a high-contrast, magnified image of the surface of the target 101. The images are analyzed by an image analyzer 116.

The target 101 may optionally include one or more test structures 103. The test structures typically correspond in dimensions (e.g., diameter and depth) to one or more integrated circuit structures 105 that may be located on the target 101 or on another wafer. By way of example, and without loss of generality, the integrated circuit structures 105 may be conductive interconnects between adjacent layers of an integrated circuit device. Such interconnects may be formed by etching holes through a layer of insulating material 107 and filling the holes with a conductive or semiconductive material 109, e.g., tungsten or silicon.

An electron activated etching gas or vapor composition 117 is introduced from one or more remote sources 118 via a conduit 119. It is desirable to introduce the etching gas or vapor as close as possible to the point on the surface of the target 101 impacted by the electrons from the electron beam column 102. By way of example, the etching gas or vapor may be introduced between two adjacent electrodes of the immersion lens 104. The electrons activate localized etching of the target surface 101. Images of the etched surface generated by the image analyzer may be analyzed by the image analyzer 116. The image analysis determines a measure of quality of the test structures 103, e.g., the number and size of voids resulting from the formation of interconnect structures.

As shown in the block diagram of FIG. 1B, the image generator 114 and image analyzer may be part of a controller 120. The controller 120 may be a self-contained microcontroller. Alternatively, the controller 120 may be a general purpose computer configured to include a central processor unit (CPU) 122, memory 124 (e.g., RAM, DRAM, ROM, and the like) and well-known support circuits 128 such as power supplies 121, input/output (I/O) functions 123, clock 126, cache 134, and the like, coupled to a control system bus 130. The memory 124 may contain instructions that the CPU 122 executes to facilitate the performance of the system 100. The instructions in the memory 124 may be in the form of the program code 125. The code 125 may control, e.g., the electron beam voltage and current produced by the source 115, the focusing of the beam with the beam optics 135 and the immersion lens 104 and the scanning of the electron beam by the coils 106 and the formation of images with the signal from the detector 110 in a conventional fashion. The code 125 may also implement analysis of the images.

The code 125 may conform to any one of a number of different programming languages such as Assembly, C++, JAVA or a number of other languages. The controller 120 may also include an optional mass storage device, 132, e.g., CD-ROM hard disk and/or removable storage, flash memory, and the like, which may be coupled to the control system bus 130. The controller 120 may optionally include a user interface 127, such as a keyboard, mouse, or light pen, coupled to the CPU 122 to provide for the receipt of inputs from an operator (not shown). The controller 120 may also optionally include a display unit 129 to provide information to the operator in the form of graphical displays and/or alphanumeric characters under control of the processor unit 122. The display unit 129 may be, e.g., a cathode ray tube (CRT) or flat screen monitor.

The controller 120 may exchange signals with the imaging device scanner driver 108, the e-beam driver 135 and the detector 110 or amplifier 112 through the I/O functions 123 in response to data and program code instructions stored and retrieved by the memory 124. Depending on the configuration or selection of controller 120 the scanner driver 108 and detector 110 or amplifier 112 may interface with the I/O functions via conditioning circuits. The conditioning circuits may be implemented in hardware or software form, e.g., within code 125.

FIG. 2 illustrates a method 200 for etch selectivity enhancement during electron beam activated chemical etch (EBACE). At 202 the target 101 or a portion thereof is exposed to the gas composition 117. The gas composition is of a type that etches nearby portions of the target 101 when the gas composition 117 is exposed to the electron beam. At 204 the electron beam is directed toward the target 101 in the vicinity of the gas composition 117. An interaction between the electron beam and the gas composition 117 etches a portion of the target 101 exposed to both the gas composition 117 and the electron beam. At 206 a selectivity of etching of the target due to interaction between the electron beam and gas composition 117 is enhanced.

Figure 3A:
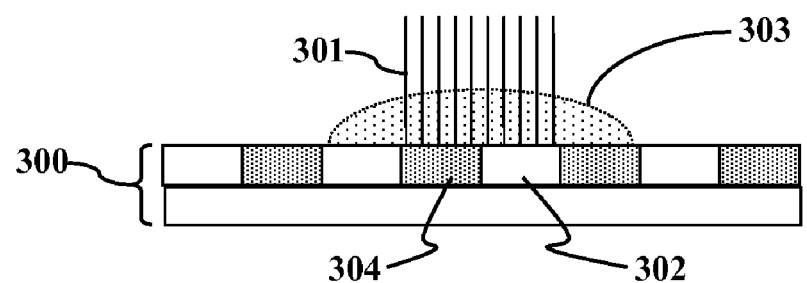
FIGS. 3A-3C are cross-sectional schematic diagrams illustrating etch selectivity enhancement during eBACE according to an embodiment of the present invention.
Figure 3B:
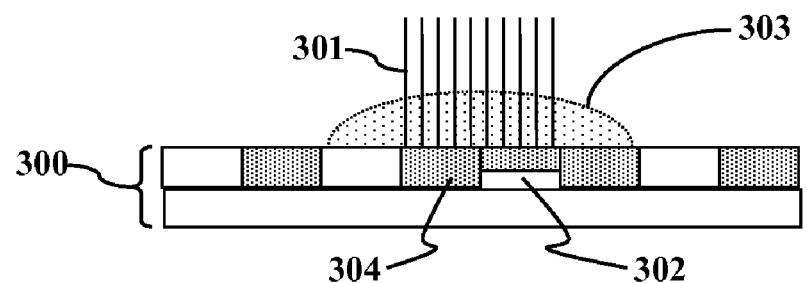
Figure 3C:
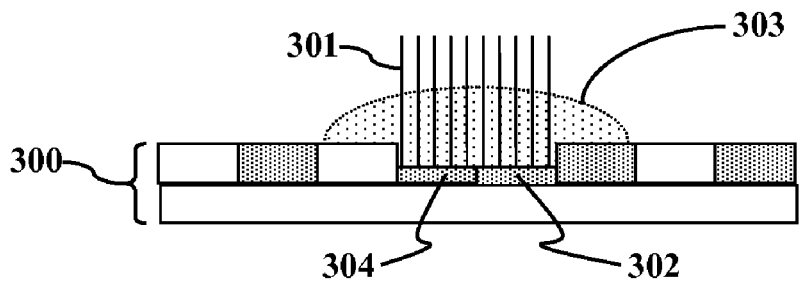

There are a number of different techniques for enhancing etch selectivity according to embodiments of the present invention. For example, as illustrated in FIGS. 3A-3C, a target 300 may include first and second regions 302, 304 respectively made of first and second different materials that are exposed to an electron beam 301 and gas composition 303. Etch selectivity may be enhanced if a gas composition 303 is chosen such that the interaction between the electron beam 301 and gas composition 303 converts the first material into the second material as shown in FIG. 3B. As a result of such conversion, the first and second regions 302, 304 may be etched at substantially the same rate. By way of example, the second material may be an oxide or carbide of the first material. Specifically, the first material may be silicon and the second material may be silicon oxide. The gas composition 303 may include a carbon-containing organic compound, an etchant and oxygen. By way of example, if the first region 302 is made of silicon and the second region 304 is made of silicon oxide the carbon-containing organic compound may be a hydrocarbon, such as methane or ethylene, and the etchant may be xenon di-fluoride ($XeF_2$).

Depending on the materials of the first and second regions, many other possible combinations of carbon-containing and etchant gases may be used. For example, nitrogen ($N_2$), hydrogen ($H_2$) and water vapor ($H_2O$) may be used as etchants for organic materials. Furthermore, some gases may be used as either an etchant or passivating gas. For example, carbon monoxide gas may be used as an etch gas to form volatile carbonyl compounds, e.g., from tungsten, upon interaction with the electron beam and the material the first or second region. Carbon monoxide may also be used to passivate tungsten and convert it to, e.g., tungsten carbide.

Figure 4A:
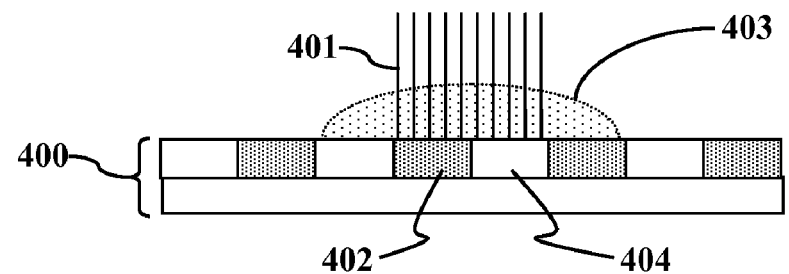
FIGS. 4A-4C are cross-sectional schematic diagrams illustrating etch selectivity enhancement during eBACE according to an alternative embodiment of the present invention.
Figure 4B:
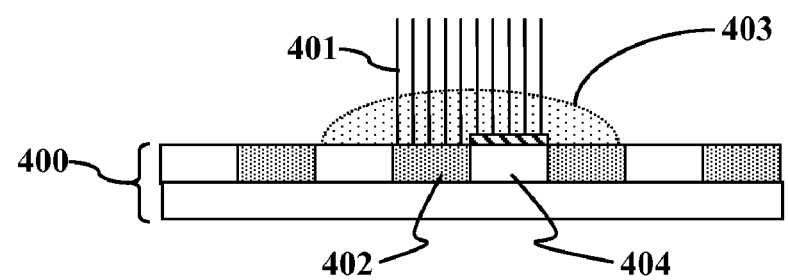
Figure 4C:
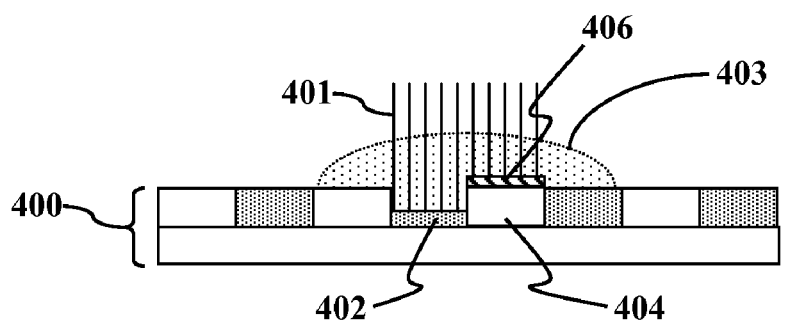

Variations on the technique described above with respect to FIGS. 3A-3C may enhance etch selectivity by facilitating etching of different regions of the target at different rates. For example, as illustrated in FIGS. 4A-4C a target 400 may include a first region 402 containing a first material and a second region 404. The first and second regions 402, 404 are exposed to an electron beam 401 and a gas composition 403. Selectivity of etching of the target due to an interaction between the electron beam and gas composition may be enhanced by covering the second material but not the first material with a third material 406 as shown in FIG. 4B. Preferably, the third material 406 is one that reduces a rate of etching of the second material relative to the first material. As a result, the second region 404 is etched at a lower rate than the first region 402, as shown in FIG. 4C. By way of example the third material 406 may be carbon. To deposit carbon, the gas composition 403 may include a carbon-containing organic compound, an etchant and oxygen. Specifically, the carbon-containing organic compound may be a hydrocarbon, such as methane or ethylene, and the etchant may be xenon di-fluoride ($XeF_2$). Other carbon containing gases include carbon monoxide, as described above. Alternative etchants include nitrogen, hydrogen and water vapor and carbon monoxide, as described above.

Figure 5A:
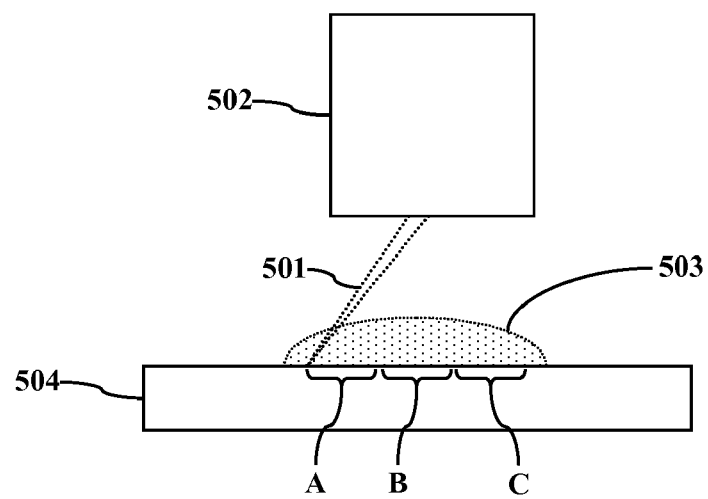
FIGS. 5A-5D are cross-sectional schematic diagrams illustrating etch selectivity enhancement by variation of an electron beam scanning pattern during eBACE according to another alternative embodiment of the present invention.
Figure 5B:
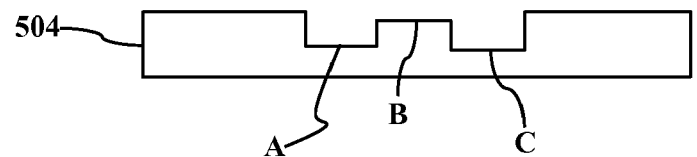
Figure 5C:
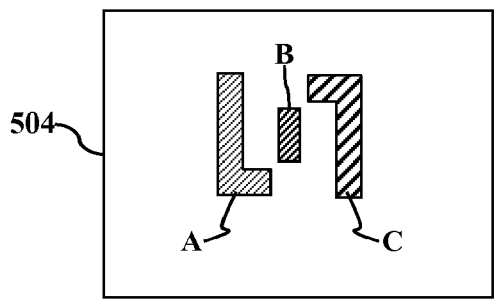

In other embodiments of the invention the selectivity of etching may be enhanced by adjusting an electron beam energy, an electron beam current or a scanning pattern of the electron beam from the electron beam column 102. For example as shown in FIG. 5A the scanning pattern of the electron beam 501 from a beam column 502 may be adjusted by varying a dwell time or a repetition rate of the electron beam 501 for different regions A, B, C of a target 504. By way of example, the dwell time may be larger for regions A and C compared to region B. Consequently, interaction between the electron beam an electron-beam activated gas composition 503 and the target 504 results in a greater etching of regions A and C compared to region B as shown in FIG. 5B. The dwell time and/or repetition rate of the electron beam may be controlled, e.g., through appropriate configuration of the code 125 running on the controller 120. As shown in FIG. 5C, the scanning pattern may be varied in such a way as to etch two dimensional patterns in regions A, B and C to different depths.

It is noted that if the contribution of the gas composition 503 to etching of the target 504 by the electron beam 501 does not vary significantly, the etching may be very finely controlled through precise control of the electron beam 501. To keep the contribution of the gas composition 503 to the etching from varying significantly the scanning pattern of the electron beam 501 may be adjusted for different regions of the target 504, e.g., by varying dwell time and/or repetition rate without varying the gas composition 503. As used herein varying the gas composition 503 may include, but is not limited to varying stoichiometric ratios and/or flow rates, etc for gases making up the gas composition 503.

Figure 5D:
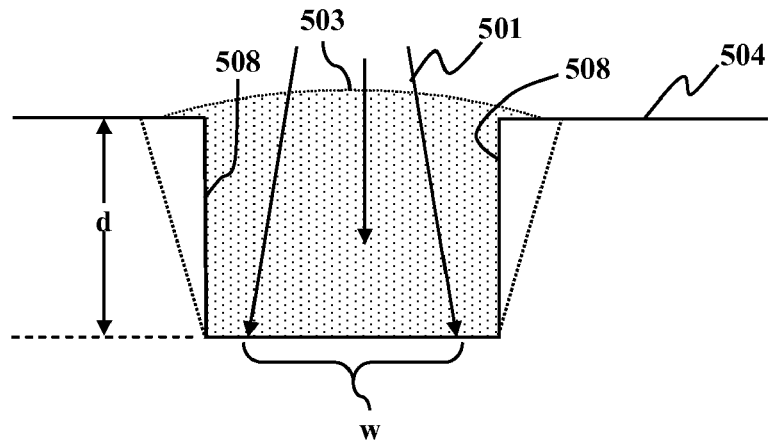

As shown in FIG. 5D, the scanning pattern of the electron beam 501 may vary as a function of depth. For example, etching the target 504 to a sufficient depth may form a feature having one or more sidewalls 508. If the scanning pattern remains more or less unchanged as a function of depth, the etching of the target 504 tends to attack the sidewall 508 resulting in a slanted sidewall, as indicated by the dotted line. To avoid this effect the scanning pattern of the electron beam 501 may be varied as a function of etch depth d to produce a more or less vertical sidewall (i.e., a sidewall that is substantially perpendicular to a plane of the target 504. By way of example, a width w of the scanning pattern may be varied as a function of depth of etching of the target 504. The scan width w may be defined as a range of excursion of the electron beam 501 along a direction parallel to a plane of the target. For example, if the target plane is more or less horizontal, the scan width w may be a horizontal range of excursion of the electron beam 501. The horizontal range of excursion of the electron beam 501 may be adjusted, e.g., through appropriate control of the scanner 106 with the scanner driver 108. To fabricate the sidewall 508 such that it is substantially vertical, the scanning pattern of the electron beam 501 may be varied as a function of time such that the scan width w narrows as a feature is etched more deeply into the target 504.

Figure 6A:
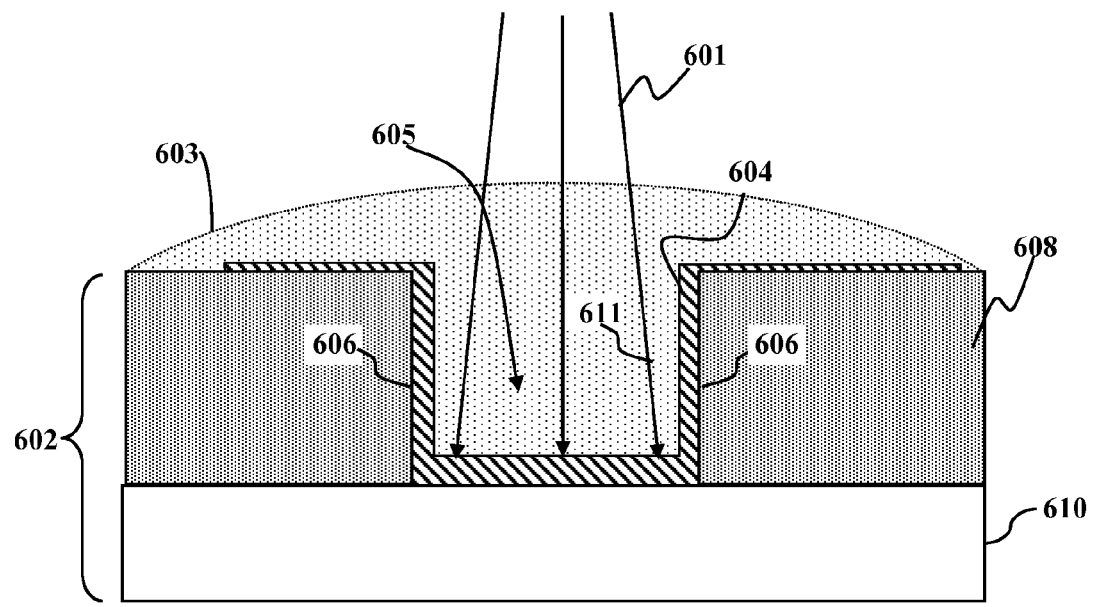
FIGS. 6A-6D are cross-sectional schematic diagrams illustrating etch selectivity enhancement through the use of a passivating material during eBACE according to another alternative embodiment of the present invention.
Figure 6B:
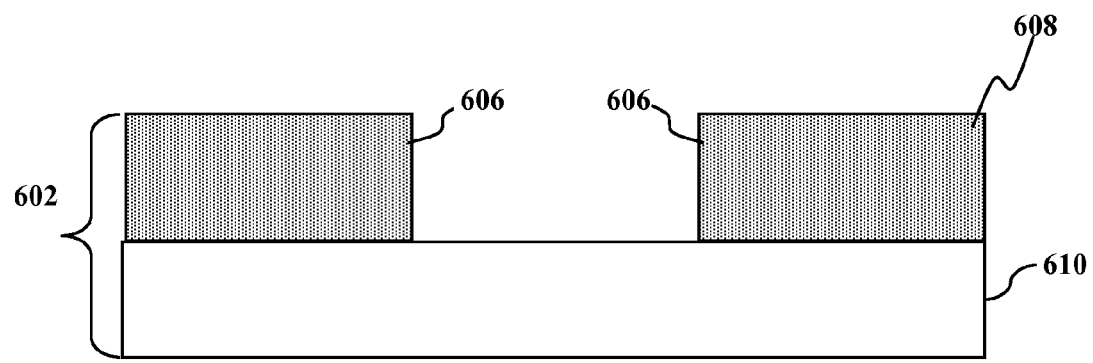
Figure 6C:
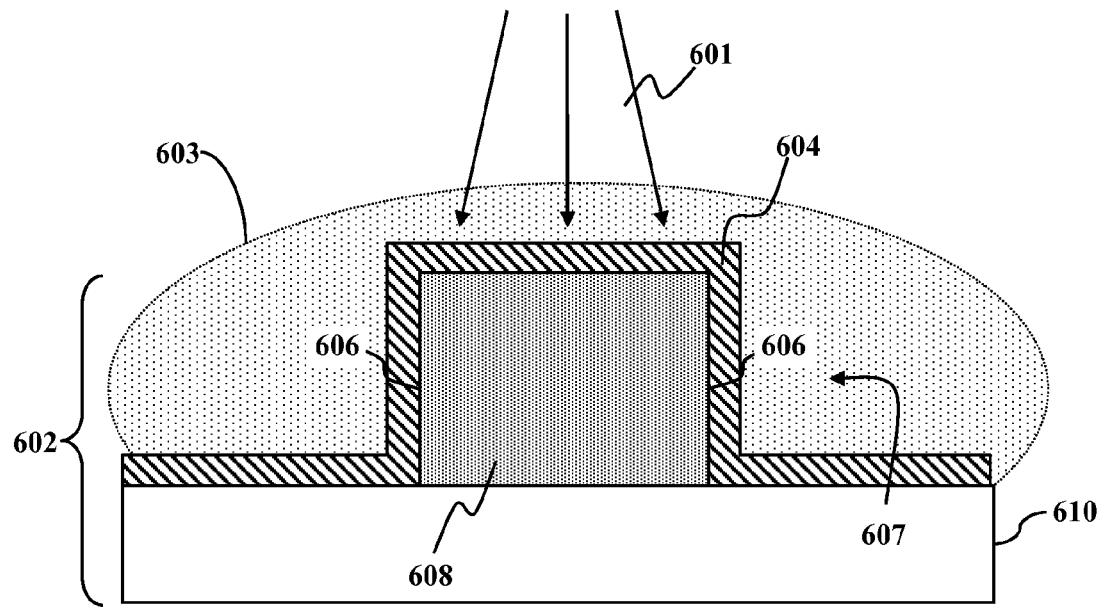

In alternative embodiments, the selectivity of etching of a target 602 with an electron beam 601 and gas composition 603 may be enhanced by depositing a passivating material 604 on selected portions of the target 602 as shown in FIGS. 6A-6D. Preferably, the passivating material 604 is one that reduces a rate of etching of the material of the target 602 due to interaction between the electron beam 601 and gas composition 603. By way of example, the passivating material 604 may be deposited on one or more sidewalls of one or more features formed on the target. For example, as shown in FIG. 6A, the passivating material may be deposited over sidewalls 606 of a negative feature 605 such as a trench or via. Alternatively, as shown in FIG. 6C, the passivating material 604 may be deposited over a positive feature 607, e.g., a line or mesa.

Figure 6D:
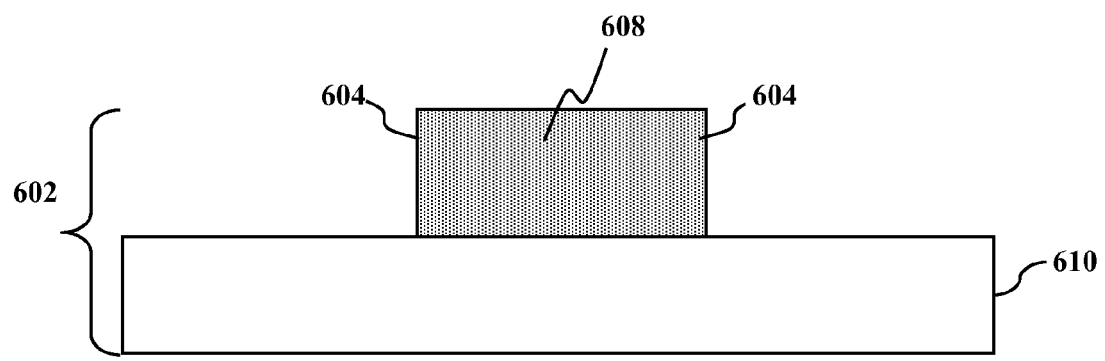

The passivating material 604 inhibits etching of the sidewalls 606 while allowing etching of nearby portions of the target. As a result, the sidewalls 606 retain their shape and/or orientation as the thickness of the nearby portions is reduced. In the examples shown in FIGS. 6A-6D the target may have portions made of different materials. For example, as shown in FIGS. 6A-6B, the negative feature 605 may be formed in a layer of silicon oxide 608 that overlies a layer of silicon 610. Alternatively, as shown in FIGS. 6C-6D, the positive feature 607 may be formed from a layer of silicon oxide 608 that overlies a layer of silicon 610. By appropriate choice of the gas composition 603 and passivating material 604, the electron beam 601 may etch the silicon oxide 608, but not the silicon 610 as shown in FIG. 6B and FIG. 6D. For example, the gas composition 603 may include a carbon-containing organic component (e.g., a hydrocarbon such as methane or ethylene) such that carbon is deposited as the passivating material 604. In such a case, it is desirable that the gas composition 603 include an etchant that, upon activation by the electron beam 601, preferentially etches portions of the target 602 that are not coated with carbon. An example of such an etchant is xenon di-fluoride ($XeF_2$). Alternative etchants include nitrogen, hydrogen, water vapor and carbon monoxide, as described above. Other carbon containing gases include carbon monoxide, as described above.

In some embodiments, the gas composition 603 may include an inert gas (e.g., Argon or Nitrogen) to further enhance etch selectivity. The inert gas, or a portion thereof, may be ionized the electron beam 601 thereby producing ions 611. By applying an appropriate voltage to the target 602 the ions 611 may bombard the target 602. The ion bombardment may advantageously liberate oxygen from oxygen-containing portions of the target 602. For example, ion bombardment may release oxygen from the silicon oxide 608 but not the silicon 610. The oxygen released by the bombardment may remove passivating material 604 (e.g., carbon) from the silicon oxide 608 but not nearby portions of the silicon 610. As a result, the silicon oxide 608 may be subject to etching by interaction with the electron beam 601 and gas composition 603 but the silicon 610 is not.

In alternative embodiments, the gas composition 603 may include a reactive gas. The reactive gas may react with the passivating material 604 such that the passivating material 604 is removed from the target 602. For example, the gas composition 603 may include oxygen, which may react with carbon passivating material. In other embodiments, nitrogen ($N_2$) may be used as the reactive gas, e.g., to form volatile cyanides (CN) from the carbon and facilitate its removal.

Figure 7A:
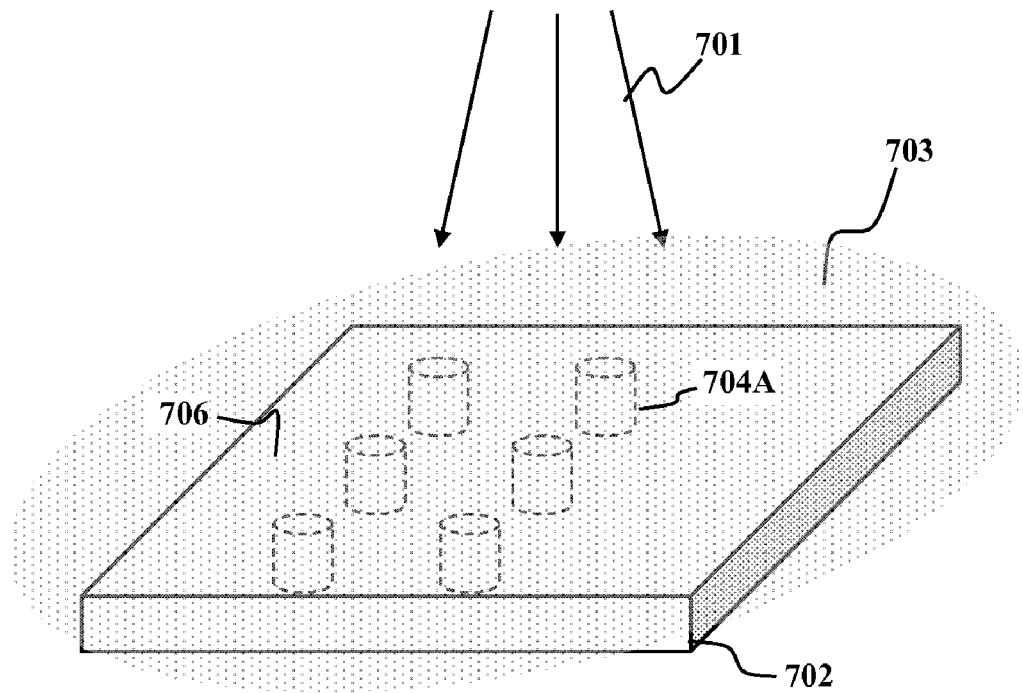
FIGS. 7A-7D are three-dimensional schematic diagrams illustrating etch selectivity enhancement during eBACE through embedding of structures in a target.
Figure 7B:
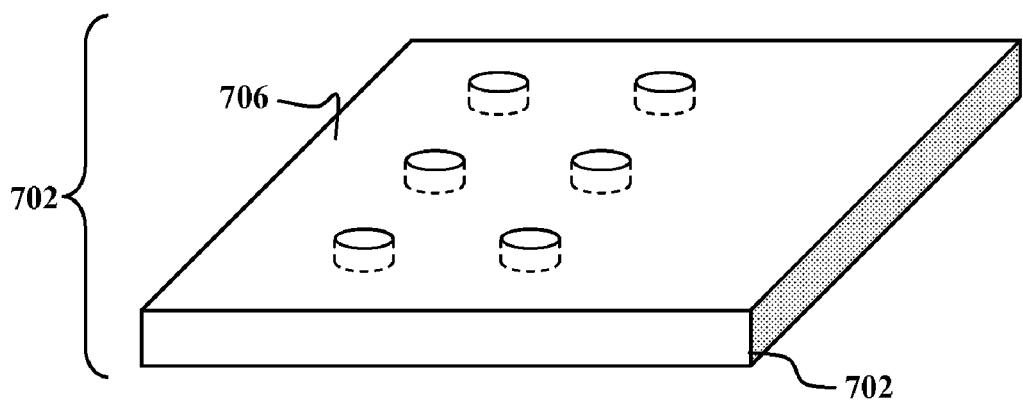

In other embodiments, the selectivity of etching of a target may include embedding within the target a structure that reacts differently with the electron beam and gas composition than other nearby portions of the target. For example, as shown in FIG. 7A a target 702 may have embedded within it one or more structures 704A. The material composition of the structures 704A is selected such that the interaction between an electron beam 701 and the gas composition 703 etches more the structures 704A more rapidly than the other nearby portions 706 of the target 702. Rapid disappearance of the structures 704A as shown in FIG. 7B may serve as an endpoint indicator for an eBACE etching process.

Figure 7C:
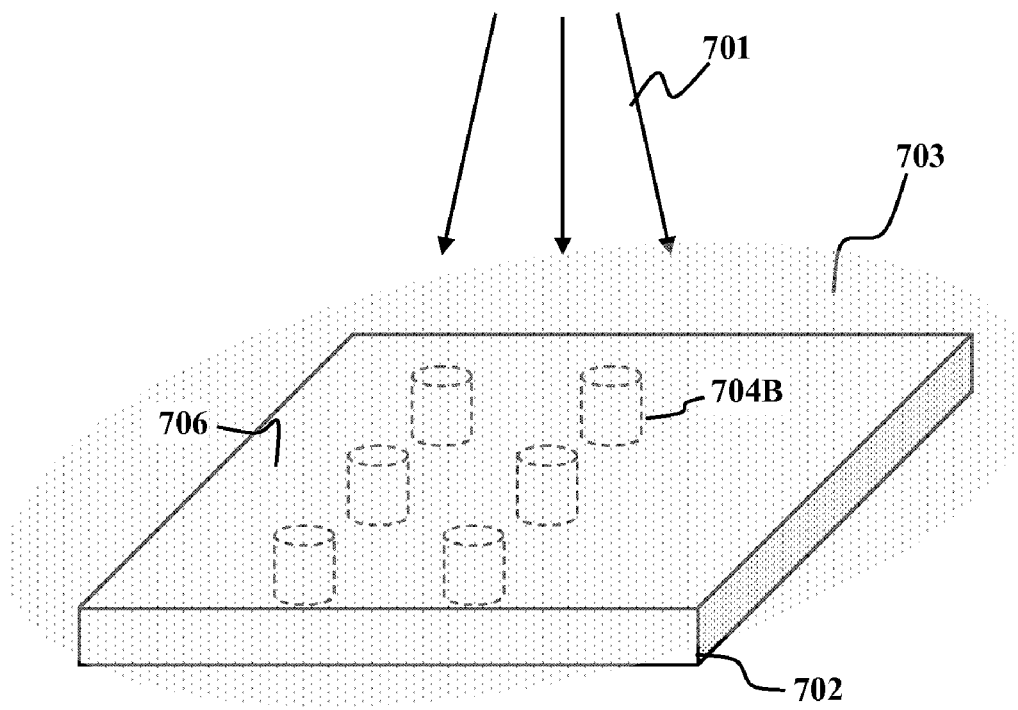
Figure 7D:
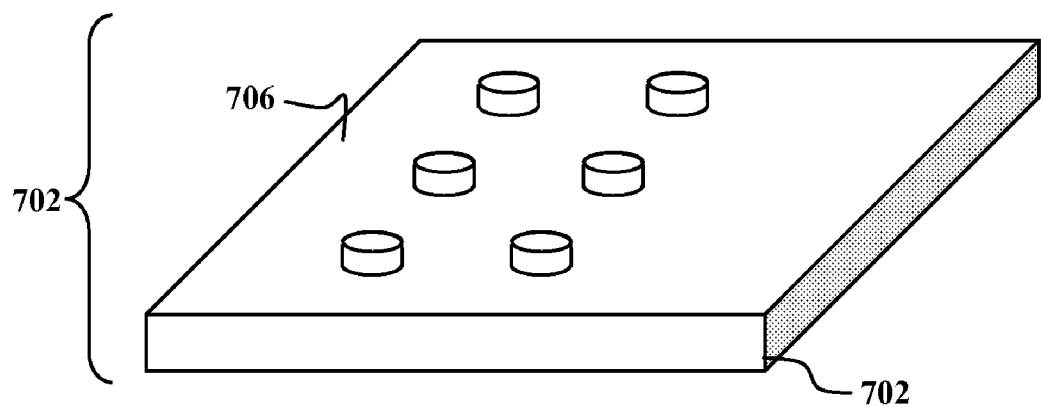

Alternatively, structures 704B, sometimes referred to as "floaters" may be embedded in the target 702 as shown in FIG. 7C. The material composition of the "floater" structures 704B may be selected such that the interaction between the electron beam 701 and the gas composition 703 etches the floater structures 704 more slowly than the other nearby portions 706 of the target 702. As a result, the appearance of the structures 704 may serve as an endpoint indicator for an eBACE etch process as shown in FIG. 7D. In general, it is desirable that the material of the "floater" structures 704B is one that does not form volatile byproducts upon an eBACE reaction with the etchant in the gas composition 703. Examples of suitable materials for such floater structures 704B include gold and hafnium carbide, which is generally not etchable by eBACE using certain etchants, such as $XeF_2$ in the gas composition 703. Other examples include silicon oxide and silicon nitride, which would be etched more slowly by a $XeF_2$ eBACE reaction than nearby regions of silicon.

Figure 8A:
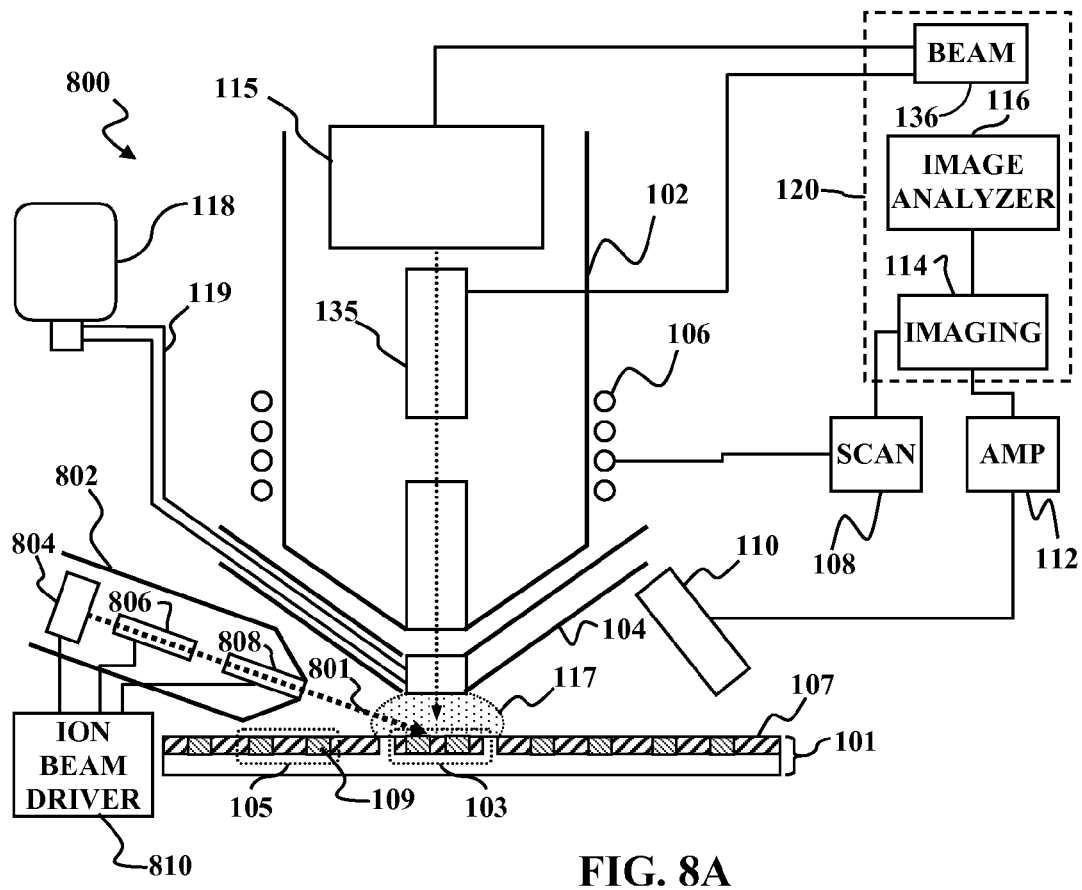
FIG. 8A is a schematic diagram of an electron beam activated chemical etch (EBACE) apparatus adapted for etch selectivity enhancement through use of a focused ion beam according to an embodiment of the present invention.
Figure 8B:
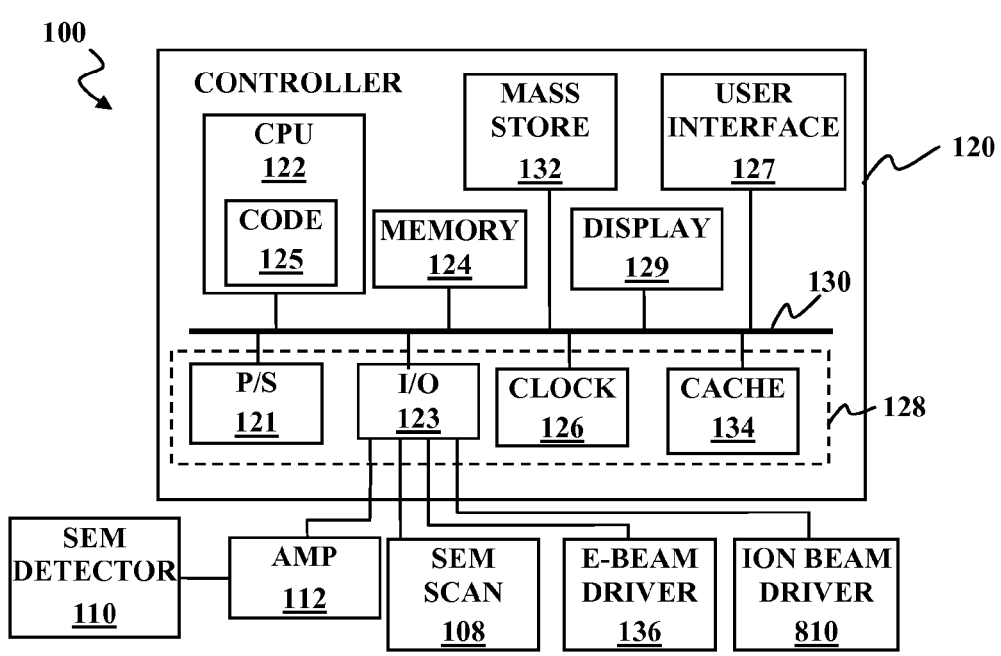
FIG. 8B is a block diagram of the apparatus of FIG. 8A

In some cases, the target 101 may contain one or more materials that are not removable by etching due to the interaction between the electron beam and gas composition 117. For example, certain metals, such as Nickel, Cobalt, Gold and Hafnium, typically do not form volatile products when subject to eBACE. Such materials may be present as impurities or may be present as part of a structure that is to be removed. In such situations, selectivity of etching of the target may be enhanced by using a focused ion beam in conjunction with eBACE to remove such materials from the target. FIGS. 8A-8B illustrate an example of an apparatus 800 for implementing such a technique. The apparatus 800 may generally include the electron beam column 102, with its associated components, e.g., immersion lens 104, scanner coils 106, electron source 115, beam optics 135 e-beam driver 136, controller 120, etc. as described above with respect to FIGS. 1A-1B. The apparatus 800 may also include remote gas sources 118 and conduit 119 adapted to introduce the electron activated gas composition 117 to the vicinity of a target 101 as described above.

In addition to the above-described components, the apparatus 800 includes a focused ion beam source 802. The ion beam source 802 may include an ion source 804 where ions are generated, ion beam optics 806 that extract and/or collimate an ion beam 801 from the source 804 and an immersion lens 808 adapted to focus the ion beam 801 onto the target 101 with sufficient beam energy and beam current to sputter material from the surface of the target. The ion beam source 802 may also include a beam scanning mechanism, e.g., coils or raster plates to steer the ion beam 801 over the target 101. The components of the ion source 802 may controlled by electronics 810, referred to herein as an ion beam driver. The ion beam driver 810 may be coupled to the controller 120, e.g., via the I/O functions 123. The program code 125 may include instructions that control sputtering of the selected portions of the target with the ion beam 801.

In other embodiments of the invention etch selectivity during eBACE may be enhanced by including in the gas composition 117 one or more decontaminating gases that react with the target 101 in such a way as to remove one or more contaminants from the target and/or prevent contamination of the target 101 by the one or more contaminants. By way of example, carbon contamination may be removed and/or prevented in this fashion through the inclusion of oxygen in the gas composition 117 as a decontaminating gas. Alternatively, decontaminating gases may include nitrogen ($N_2$), argon (Ar), xenon (Xe), or hydrogen ($H_2$).

Figure 9A:
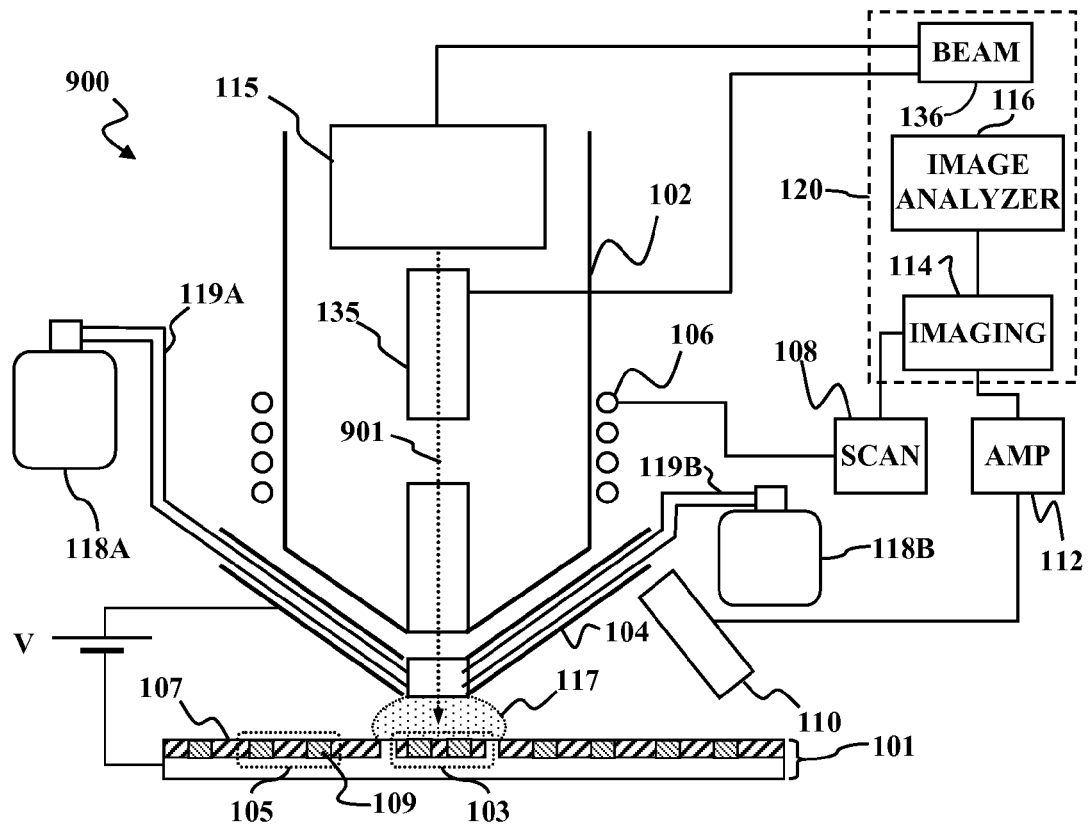
FIG. 9A is a schematic diagram of an electron beam activated chemical etch (EBACE) apparatus adapted for etch selectivity enhancement through use of a decontaminating gas.

FIG. 9A depicts an example of an apparatus 900 that may be used in embodiments of the invention involving the use of decontaminating gases. The apparatus 900 may generally include the electron beam column 102, with its associated components, e.g., immersion lens 104, scanner coils 106, electron source 115, beam optics 135 e-beam driver 136, controller 120, etc. as described above with respect to FIGS. 1A-1B. The apparatus 900 may also include multiple remote gas sources 118A, 118B and conduits 119A, 119B adapted to introduce the electron activated gas composition 117 to the vicinity of a target 101 as described above. The remote gas source 118A, 118B may respectively supply an etchant and a decontaminating gas to the gas composition 117.

Preferably, the decontaminating gas is delivered in close proximity to the target with a high pressure profile proximate to an intersection between the beam of electrons and the target. Decontaminating gases such as Nitrogen, Argon, Xenon and Hydrogen may be used to generate a localized plasma by pulsing an extraction field applied in the vicinity of the target. A pulsed voltage V may optionally be applied between the immersion lens 104 and the target 101 to provide the pulsed extraction field. A source of the voltage V may be switched on and off to provide the desired pulsing. Ions from the plasma may bombard the target and sputter react with or otherwise remove contaminants from the target 101.

Figure 9B:
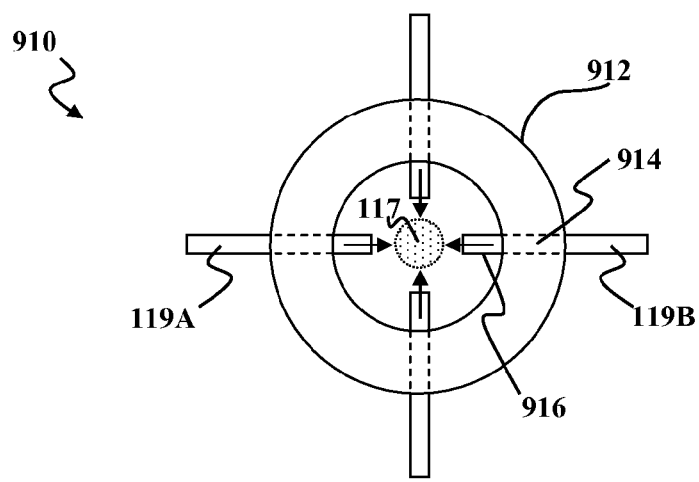
FIG. 9B is a top view schematic diagram of a gas injection manifold that may be used with the apparatus of FIG. 9A.

In some embodiments, it is desirable to deliver the decontaminating gases using a gas system having separate gas injection pathways for gases that would otherwise react undesirably if mixed in a single feed line. Examples of combinations of gases that may undesirably react in a feed line include corrosives and oxidizers, e.g., chlorine and water vapor. FIG. 9B depicts an example of a gas manifold 910 that may be used in the apparatus 900 to deliver the components of the gas composition 117 (including decontaminating gases) with separate gas feed lines. The manifold 910 may be attached to or incorporated into the immersion lens 104 as shown in FIG. 9A. The manifold 910 includes a ring 912 having passages 914 that can be coupled to separate feed lines, e.g., conduits 119A, 119B at an outer edge of the ring 912. The passages 914 communicate through the ring 912 to an inner edge. Needles 916 coupled to the passages 914 at the inner edge direct gases towards a central region proximate the target. The gas pressure profile of the gas composition 117 (and plasma) may be adjusted by appropriate choice of the number of passages and needles, the inner diameter of the ring 912, the inner diameters and lengths of the needles 916 and the flow rates of the gases.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for etch selectivity enhancement during electron beam activated chemical etch (EBACE), comprising:
    exposing a target or portion thereof to a gas composition, wherein the gas composition is of a type that etches the target when the gas composition and/or target are exposed to an electron beam;
    directing an electron beam toward the target in the vicinity of the gas composition, whereby an interaction between the electron beam and the gas composition etches a portion of the target exposed to both the gas composition and the electron beam; and
    enhancing a selectivity of etching of the target due to interaction between the electron beam and gas composition wherein the target includes a first region containing a first material and a second region containing a second material, wherein enhancing the selectivity of etching of the target includes converting the first material into the second material, whereby the first and second regions etch at substantially the same rate.

2. The method of claim 1 wherein the second material is an oxide of the first material.

3. The method of claim 2, wherein the first material is silicon and the second material is silicon oxide.

4. The method of claim 1 wherein the gas composition includes a carbon-containing organic compound, an etchant and oxygen.

5. The method of claim 4 wherein the carbon-containing organic compound is a hydrocarbon or carbon monoxide.

6. The method of claim 5, wherein the hydrocarbon is methane or ethylene.

7. The method of claim 4 wherein the etchant is xenon di-fluoride ($XeF_2$), nitrogen ($N_2$), hydrogen ($H_2$), water vapor ($H_2O$) or carbon monoxide.

8. The method of claim 1 wherein enhancing the selectivity of etching of the target includes using a focused ion beam to remove from the target one or more materials that are not removable by etching due to the interaction between the electron beam and gas composition.

9. A method for etch selectivity enhancement during electron beam activated chemical etch (EBACE), comprising:
    exposing a target or portion thereof to a gas composition, wherein the gas composition is of a type that etches the target when the gas composition and/or target are exposed to an electron beam;
    directing an electron beam toward the target in the vicinity of the gas composition, whereby an interaction between the electron beam and the gas composition etches a portion of the target exposed to both the gas composition and the electron beam; and
    enhancing the selectivity of etching by adjusting a scanning pattern of the electron beam wherein adjusting a scanning pattern includes varying a width of the scanning pattern as a function of depth of etching of the target.

10. The method of claim 9 wherein adjusting a scanning pattern includes varying a dwell time or a repetition rate of the electron beam for different regions of the target.

11. The method of claim 9 wherein adjusting a scanning pattern includes varying a dwell time or a repetition rate of the electron beam for different regions of the target without varying the gas composition.

12. The method of claim 9 wherein enhancing the selectivity of etching of the target includes using a focused ion beam to remove from the target one or more materials that are not removable by etching due to the interaction between the electron beam and gas composition.

13. A method for etch selectivity enhancement during electron beam activated chemical etch (EBACE), comprising:
    exposing a target or portion thereof to a gas composition, wherein the gas composition is of a type that etches the target when the gas composition and/or target are exposed to an electron beam;
    directing an electron beam toward the target in the vicinity of the gas composition, whereby an interaction between the electron beam and the gas composition etches a portion of the target exposed to both the gas composition and the electron beam;
    enhancing a selectivity of etching of the target due to interaction between the electron beam and gas composition, wherein enhancing the selectivity of etching includes adjusting an electron beam energy, an electron beam current or a scanning pattern of the electron beam wherein enhancing the etch selectivity comprises including in the gas mixture one or more decontaminating gases that react with the target in such a way as to remove one or more contaminants from the target and/or prevent contamination of the target by the one or more contaminants; and
    generating a localized plasma in the vicinity of the target from the one or more decontaminating gases by pulsing an extraction field applied in the vicinity of the target and bombarding the target with ions from the plasma.

14. The method of claim 13 wherein the one or more contaminants include carbon.

15. The method of claim 14 wherein the one or more decontaminating gases include oxygen.

16. The method of claim 14 wherein the one or more decontaminating gases include nitrogen ($N_2$), argon (Ar), xenon (Xe), or hydrogen ($H_2$).

17. The method of claim 13 wherein injecting the one or more decontaminating gases in close proximity to the target includes delivering the decontaminating gases using a gas system having separate gas injection pathways for gases that would otherwise react undesirably if mixed in a single feed line.

18. The method of claim 13 wherein enhancing the selectivity of etching of the target includes using a focused ion beam to remove from the target one or more materials that are not removable by etching due to the interaction between the electron beam and gas composition.

19. The method of claim 9 wherein varying a width of the scanning pattern as a function of depth of etching of the target includes narrowing the width of the scanning pattern as a feature is etched more deeply into the target.

* * * * *